(12) United States Patent
Chang et al.

(10) Patent No.: US 7,957,118 B2
(45) Date of Patent: Jun. 7, 2011

(54) MULTI-ZONE ELECTROSTATIC CHUCK AND CHUCKING METHOD

(75) Inventors: Yi-Pin Chang, Hsinchu (TW); Tung Long Lai, Zhubei (TW); Soon Kang Huang, Hsin Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 124 days.

(21) Appl. No.: 12/433,680

(22) Filed: Apr. 30, 2009

(65) Prior Publication Data

US 2010/0277850 A1    Nov. 4, 2010

(51) Int. Cl.
*H01L 21/683* (2006.01)
*H01T 23/00* (2006.01)

(52) U.S. Cl. .......................................... 361/234
(58) Field of Classification Search ............ 361/234
See application file for complete search history.

(56) References Cited

U.S. PATENT DOCUMENTS

| | | | | |
|---|---|---|---|---|
| 5,872,694 | A * | 2/1999 | Hoinkis et al. | 361/234 |
| 5,880,923 | A * | 3/1999 | Hausmann | 361/234 |
| 6,976,901 | B1 * | 12/2005 | Halley et al. | 451/6 |
| 2009/0162179 | A1 * | 6/2009 | Hosek et al. | 414/749.2 |

OTHER PUBLICATIONS

Conation Technologies, KLA Spectra FX 100 Film Thickness Measurement Tool, Internet Article, www.conationtech.com. USA, Vintage 2003.
Computer Business Review, KLA-Tencor Launches Measurement Solution, Published Dec. 3, 2007 by BR staff writer, Internet Article, www.cbronline.com. USA, Apr. 1, 2009.
KLA-TENCOR, WaferSight 2, Internet Article, www.kla-tencor.com. USA, Mar. 31, 2009.
KLA-TENCOR, Prometrix UV-1250SE/Thin Film Measurement System—Product Description, Internet Article, www.kla-tencor.com. USA, Mar. 31, 2009.
KLA-TENCOR, SpectraFx 100/Advanced Optical Thin Film Metrology—Product Description, Internet Article, www.kla-tencor.com. USA, Mar. 31, 2009.

* cited by examiner

*Primary Examiner* — Dharti H Patel
(74) *Attorney, Agent, or Firm* — Duane Morris LLP; Steven E. Koffs

(57) ABSTRACT

A method for processing a semiconductor wafer comprises measuring data indicating an amount of warpage of the wafer. At least two different voltages are determined, based on the amount of warpage. The voltages are to be applied to respective portions of the wafer by an electrostatic chuck that is to hold the wafer. The at least two different voltages are applied to hold the respective portions of the wafer while performing a fabrication process on the wafer.

20 Claims, 6 Drawing Sheets

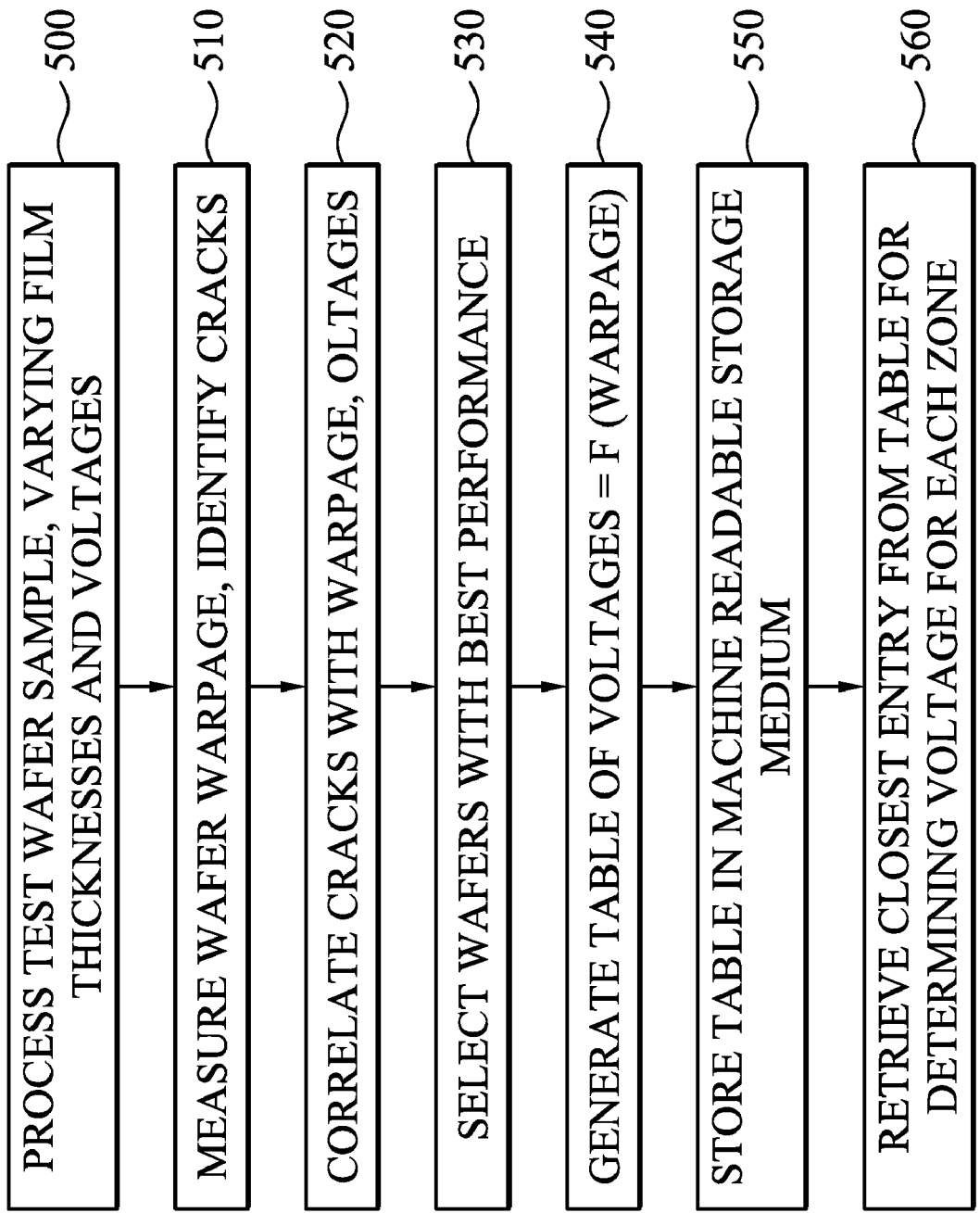

MULTI-ZONE ELECTROSTATIC CHUCK AND CHUCKING METHOD

FIELD OF THE INVENTION

The present disclosure relates to semiconductor fabrication generally, and more specifically to electrostatic chucks and chucking methods.

BACKGROUND

To reduce the unit cost of semiconductor products and increase production, semiconductor manufacturers have increased semiconductor wafer size. 300 mm wafers are now commonly used, and manufacturers are planning migration to 450 mm systems. This migration introduces new mechanical issues, or exacerbates known issues that were not previously considered significant.

One of these issues is wafer warpage. It is common to observe wafer thickness variation in larger wafers. For example, a spun-on layer may be slightly thicker at the wafer center than at the wafer edge. The absolute thickness variation (in μm) of the wafer tends to be larger if thicker layers are deposited on the wafer. The inventors have observed that in relatively large wafers (e.g., 300 mm and 450 mm), a wafer having a high thickness variation is likely to warp into a concave shape. The warpage may cause greater variation in the height of the wafer top surface than the variation in the thickness of the deposited layer. Wafer warpage can introduce unacceptable results. For example, if the wafer warpage raises the outer edge portion of the wafer, then the exposure light used in a photolithographic process may be out of focus when patterning dies near the outer edge. These focusing problems are particularly disadvantageous for technologies having a critical dimension of 45 nm or smaller. It has been estimated that slight variations in wafer flatness can consume 50% of the critical lithography depth of focus budget at 45 nm. Also, residual stresses in a warped wafer have been observed to result in cracks in the wafer.

Improved methods are desired to avoid undesired effects of wafer warpage.

SUMMARY OF THE INVENTION

In some embodiments, a method for processing a semiconductor wafer comprises measuring data indicating an amount of warpage of the wafer. At least two different voltages are determined, based on the amount of warpage. The voltages are to be applied to respective portions of the wafer by an electrostatic chuck that is to hold the wafer. The at least two different voltages are applied to hold the respective portions of the wafer while performing a fabrication process on the wafer.

In some embodiments, a semiconductor fabrication tool comprises a metrology chamber configured to measure an amount of warpage of a semiconductor substrate. A buffer chamber is sealingly coupled to the metrology chamber. A process chamber is sealingly coupled to the buffer chamber and configured for performing a material deposition or removal step on a semiconductor substrate. The process chamber has an electrostatic chuck therein. The electrostatic chuck has at least two zones having independently controllable voltages for applying a holding force to the substrate. A processor is coupled to receive data representing the amount of warpage from the metrology chamber and configured to determine the voltages of the at least two zones based on the amount of warpage. The voltages are to be used by the electrostatic chuck for applying the holding force.

In some embodiments, a computer readable storage medium is encoded with computer program code, such that when the program code is executed by a processor, the processor performs a control method for processing a semiconductor wafer. The method comprises controlling a metrology device to measure data indicating an amount of warpage of the wafer; determining at least two different voltages to be applied to respective portions of the wafer by an electrostatic chuck that is to hold the wafer, based on the amount of warpage; and controlling the electrostatic chuck to apply the at least two different voltages to hold the respective portions of the wafer while performing a fabrication process on the wafer.

DETAILED DESCRIPTION

Figure 1:
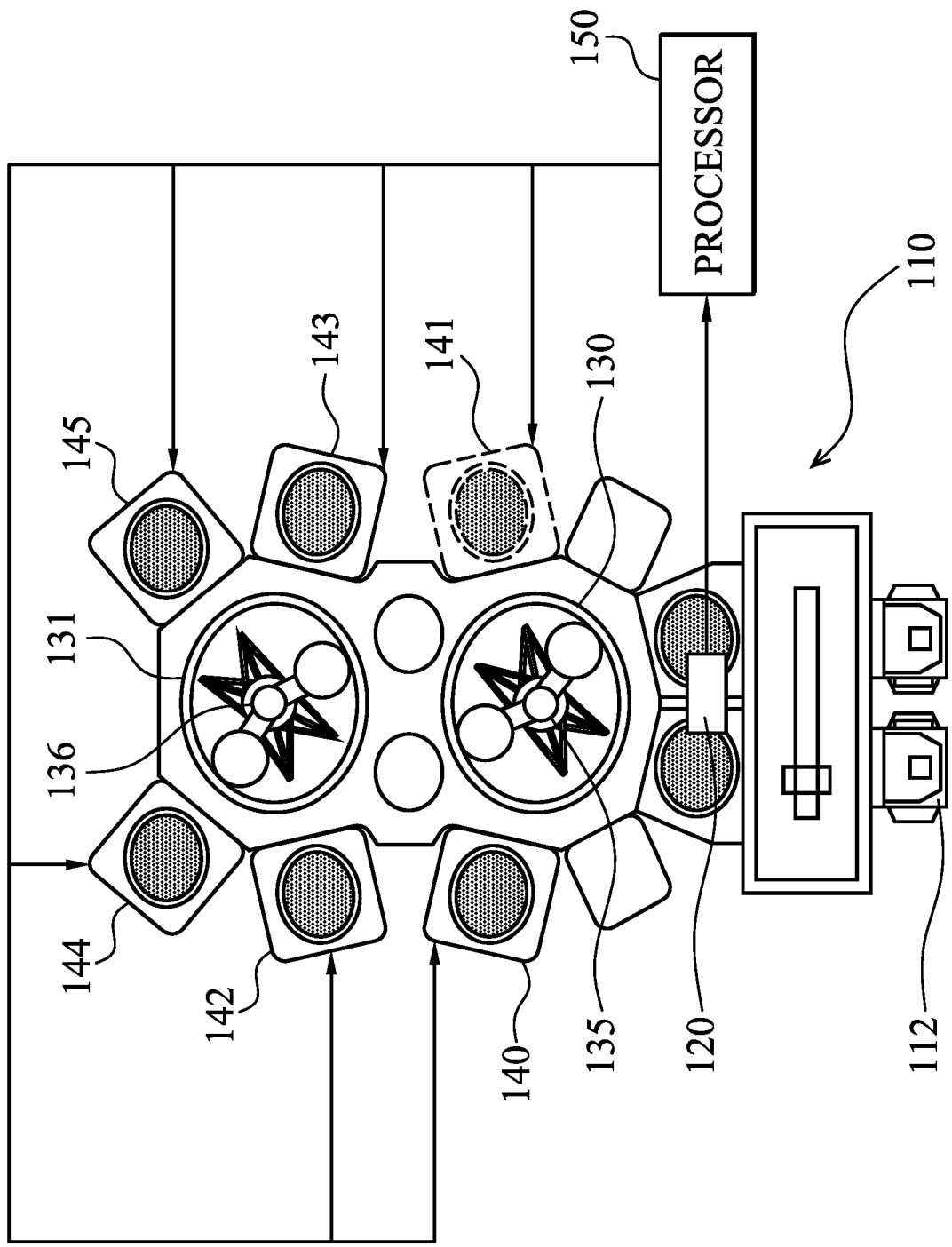
FIG. 1 is a schematic view of a tool providing in situ warpage metrology and process chambers with multi-zoned electrostatic chucks.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

FIG. 1 shows a semiconductor fabrication tool 100. The tool 100 is an integrated tool having a plurality of separate processing chambers 141-146 connected by buffer chambers 130, 131. A metrology chamber 120 is configured to measure an amount of warpage of a semiconductor substrate in situ in the tool where the fabrication process is performed.

The buffer chamber 130 is sealingly coupled to the metrology chamber 120 and process chambers 140, 141. The buffer chamber 131 is sealingly coupled to the buffer chamber 130 and process chambers 142, 145. The process chambers 142-145 are sealingly coupled to the buffer chamber 131. The metrology chamber may have a scanning laser configured for measuring the distance between the laser and the top surface of the wafer, to detect a height profile of the wafer top surface.

Metrology devices suitable for this purpose may be purchased from KLA Tencor, of San Jose, Calif. Suitable devices are found in the SPECTRA FX100 and WAFERSIGHT 2 models from KLA Tencor, for example.

The process chambers 140-145 are configured for performing a material deposition, transformation or removal step on a semiconductor substrate. For example, chambers 140-145 may be configured to deposit a dielectric layer or metal layer, perform an ion implantation process, or perform an etching process. The process chambers 140-145 each have an electrostatic chuck 200 (FIG. 2) therein. The electrostatic chuck 200 has at least two zones having independently controllable voltages for applying a holding force to the substrate.

A processor 150 is coupled to receive data representing the amount of warpage from the metrology chamber 120 and is configured to determine the voltages of the at least two zones of the respective electrostatic chuck in each processing chamber 140-145, based on the amount of warpage of each individual wafer. The voltages are to be used by the electrostatic chucks 140-145 for applying the holding force.

By applying different voltages to different regions of the wafer, the processor 150 can optimally select the voltages to minimize stress on the substrate, minimize cracking, or to flatten the substrate while performing the fabrication process, so that all regions of the substrate are properly in focus while forming patterns on the substrate. For example, where the warpage is higher than a threshold value, the voltage profile may be selected to minimize cracking. If the warpage is very low, so that cracking is a much smaller concern, the voltage profile may be selected to optimize flattening of the wafer during the process.

Figure 2:
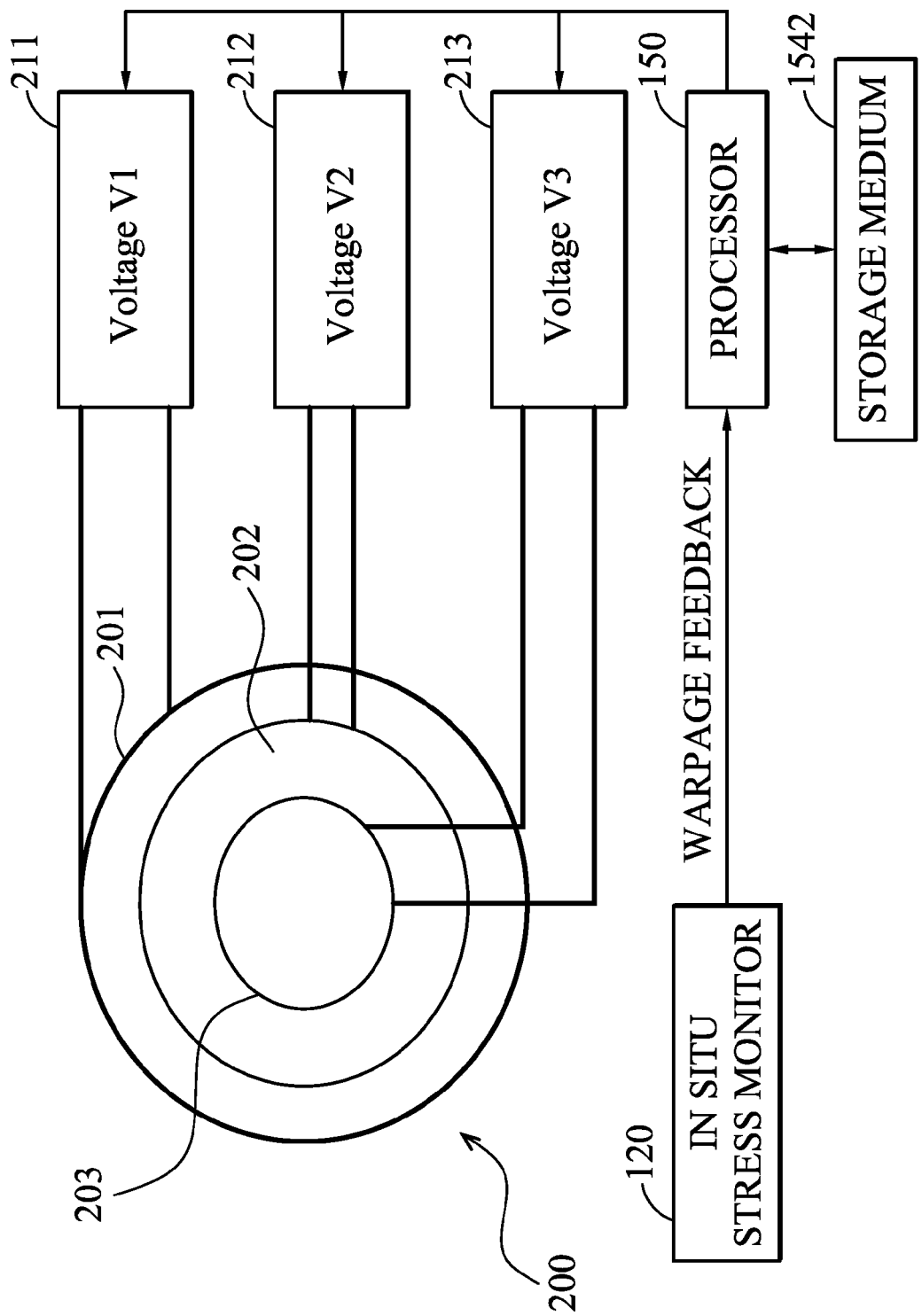
FIG. 2 is a schematic diagram of a chuck suitable for use in one of the process chambers of FIG. 1.
Figure 3:
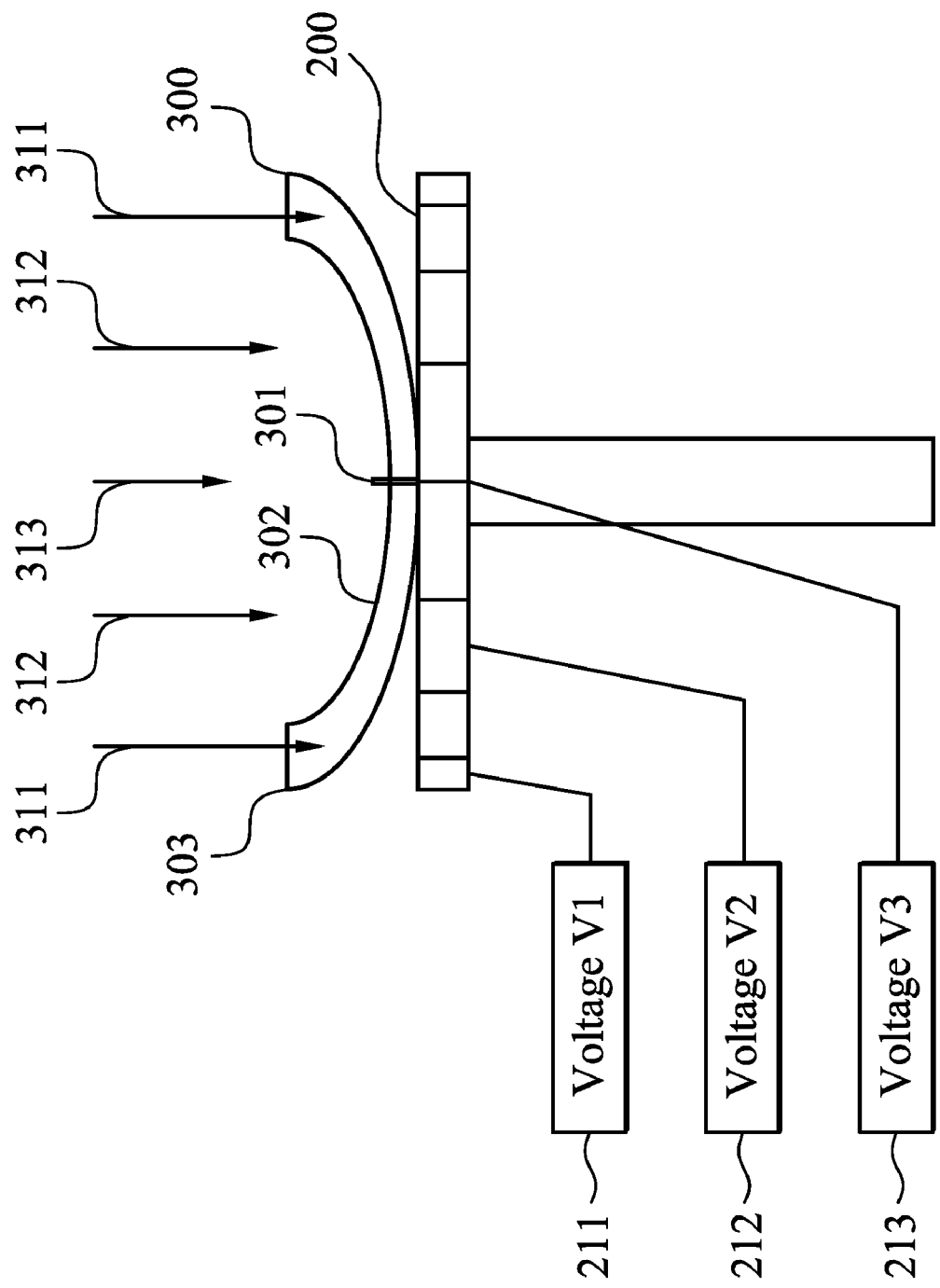
FIG. 3 is a side elevation view of the chuck of FIG. 2 applying a voltage profile for chucking a warped wafer.

FIGS. 2 and 3 show an exemplary electrostatic chuck 200. The electrostatic chuck 200 has a center zone 201 and an outer zone 203. In some situations, the voltage V1 applied to the outer zone 203 is greater than the voltage V3 applied to the center zone 201. For example, if the residual stress in the wafer 300 causes the outer edges to warp upwards, the higher voltage V1 provides a greater attractive force 311 near the outer edge than the attractive force 313 at the center, to flatten the wafer 300 and improve focus at the outer regions of the wafer. The voltage V3 applied to the center can be reduced, to minimize stress. Alternatively, in other situations, it may be desirable to have the voltage V1 at the outer edge of the wafer less than the voltage V3 in the center.

In some embodiments, the electrostatic chuck 200 has an intermediate zone 202 between the center zone 203 and the outer zone 201, and the voltage V2 applied to the intermediate zone 202 is between the voltage V1 applied to the outer zone 201 and the voltage V3 applied to the center zone 203. Thus, an intermediate force 312 if applied to the wafer, greater than the force 313 at the center, but less than the force 311 at the outer edge. In still further embodiments, four or five voltage zones may be provided, with independently controllable voltages (and chucking force per unit area).

The processor 150 is connected to a machine readable storage medium 152. The storage medium 152 contains a table of test data from a plurality of test wafers. The test data correlates test wafer cracking with a plurality of warpage amounts and respective chucking voltages for each of a plurality of zones of the test wafers. The processor 150 determines the at least two voltages V1-V3 partly based on the test data, in addition to the amount of warpage.

Figure 6:
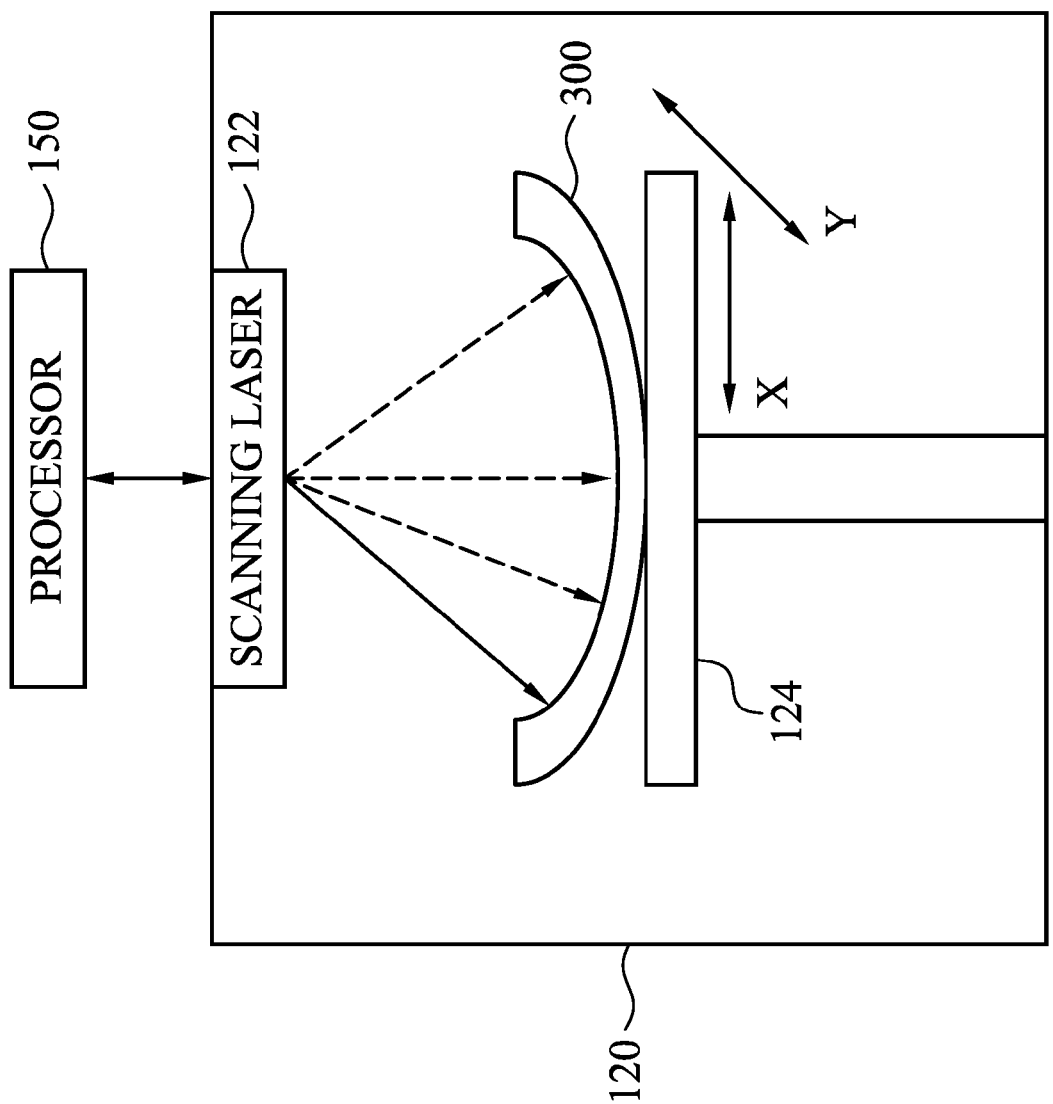
FIG. 6 is a schematic diagram of the metrology chamber of FIG. 1.

In a preferred embodiment, the metrology chamber 120 comprises a scanning laser 122 (shown in FIG. 6) for measuring a height of a top surface of the semiconductor substrate 300 at a plurality of points on the surface. Alternatively, the laser 122 may have a fixed beam, and the platen 124 holding the wafer is capable of reciprocating motion in two directions.

Figure 4:
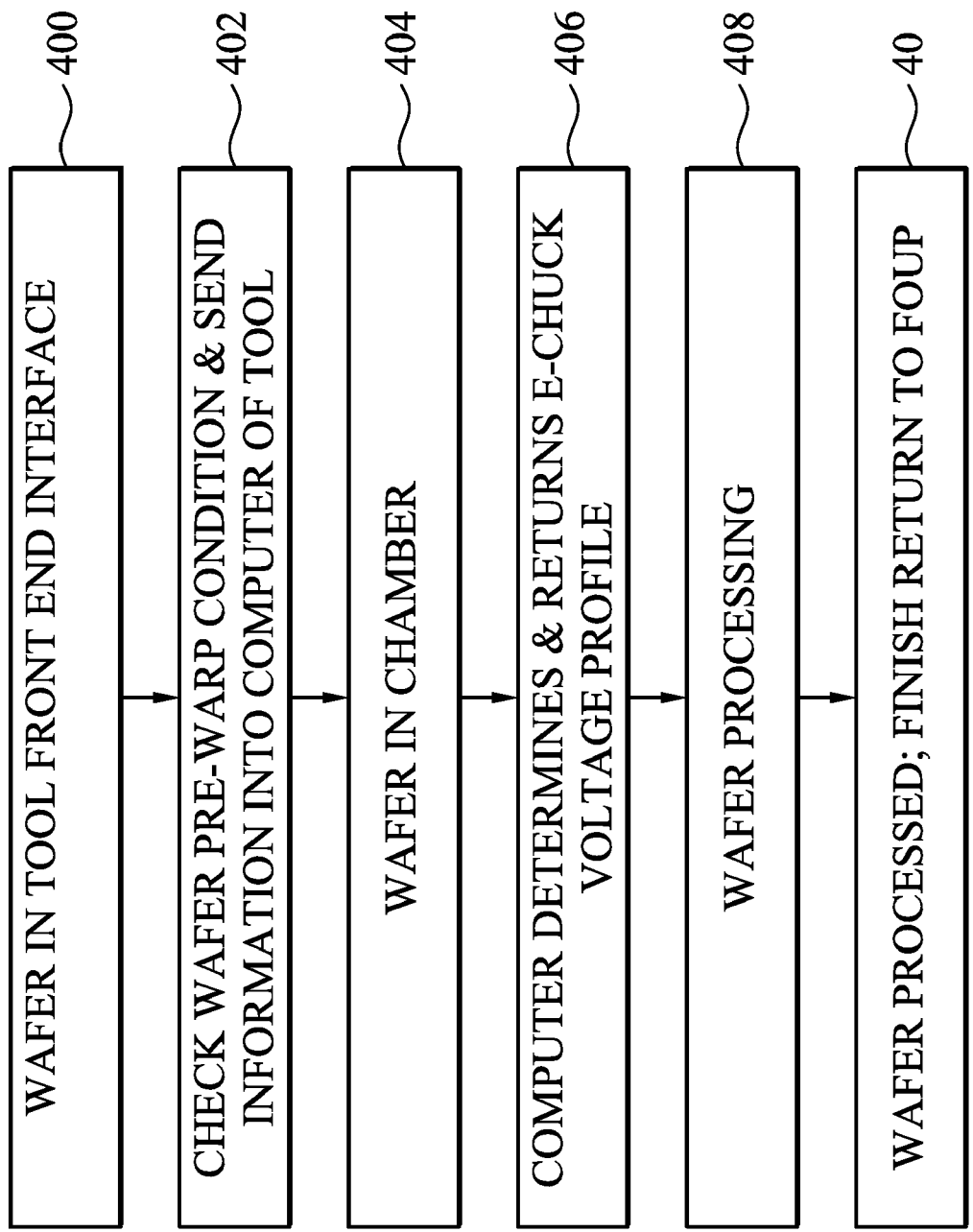
FIG. 4 is a flow chart of a method for processing a wafer in the tool of FIG. 1, using in situ warpage metrology and a chucking voltage profile in an electrostatic chuck.

FIG. 4 is a flow chart of a method for processing a semiconductor wafer 300. The process may be controlled by the processor 150.

At step 400, the wafer is provided at the metrology chamber at the front end interface of the tool 100.

At step 402, data are measured indicating an amount of warpage of the wafer. In some embodiments, the measuring includes measuring a height of a plurality of points on a top surface of the wafer. For example, the measuring may include scanning the height of the top surface of the wafer with a laser. In some embodiments, the laser 122 of the metrology chamber 120 scans back and forth across the surface of the wafer 300. In other embodiments, the laser beam is stationary, and the platen 124 holding the wafer 300 reciprocates back and forth in the X and Y directions to cause the fixed beam to scan across the surface of the wafer. In some embodiments, the displacement of the top surface due to warpage is assumed to be a function of the radius only, and to be axially symmetric. Then the warpage can be determined by measuring across one diameter of the wafer during a single pass, which is much faster than scanning back and forth several times to measure the entire surface of the wafer. This may prevent the metrology chamber from becoming a bottleneck in the process.

At step 404, the wafer 300 is transferred from the metrology tool 120 to one of the process chambers by the robotic device 135 in the buffer chamber. The wafer is transferred to the electrostatic chuck 200.

At step 406, the processor 150 determines at least two different voltages to be applied to respective portions of the wafer 300 by an electrostatic chuck 200 that is to hold the wafer, based on the amount of warpage. In the example, the processor 150 provides three voltage values V1-V3 to the voltage sources 211-213. Respective voltage sources 211-213 provide the respective voltages V1-V3 to the zones 201-203 of the electrostatic chuck. The electrostatic chuck 200 applies the at least two different voltages to hold the respective portions of the wafer 300 while performing a fabrication process on the wafer.

At step 408, the wafer processing step is performed. The wafer processing step may include a deposition step, a material transformation step, a removal step, or a patterning step, for example. The process may be performed on an active device layer or on an interconnect (back end of line) layer.

At step 410, the processing step is completed, and the wafer is returned through the front end interface of the tool 100, and returned to a wafer carrier, such as a front opening unified pod (FOUP).

Using the control method of FIG. 4, each wafer is placed in the metrology chamber for warpage measurement before performing the deposition, transformation, or removal process. The voltage profile of the electrostatic chuck is then set individually for each wafer processed.

Figure 5:
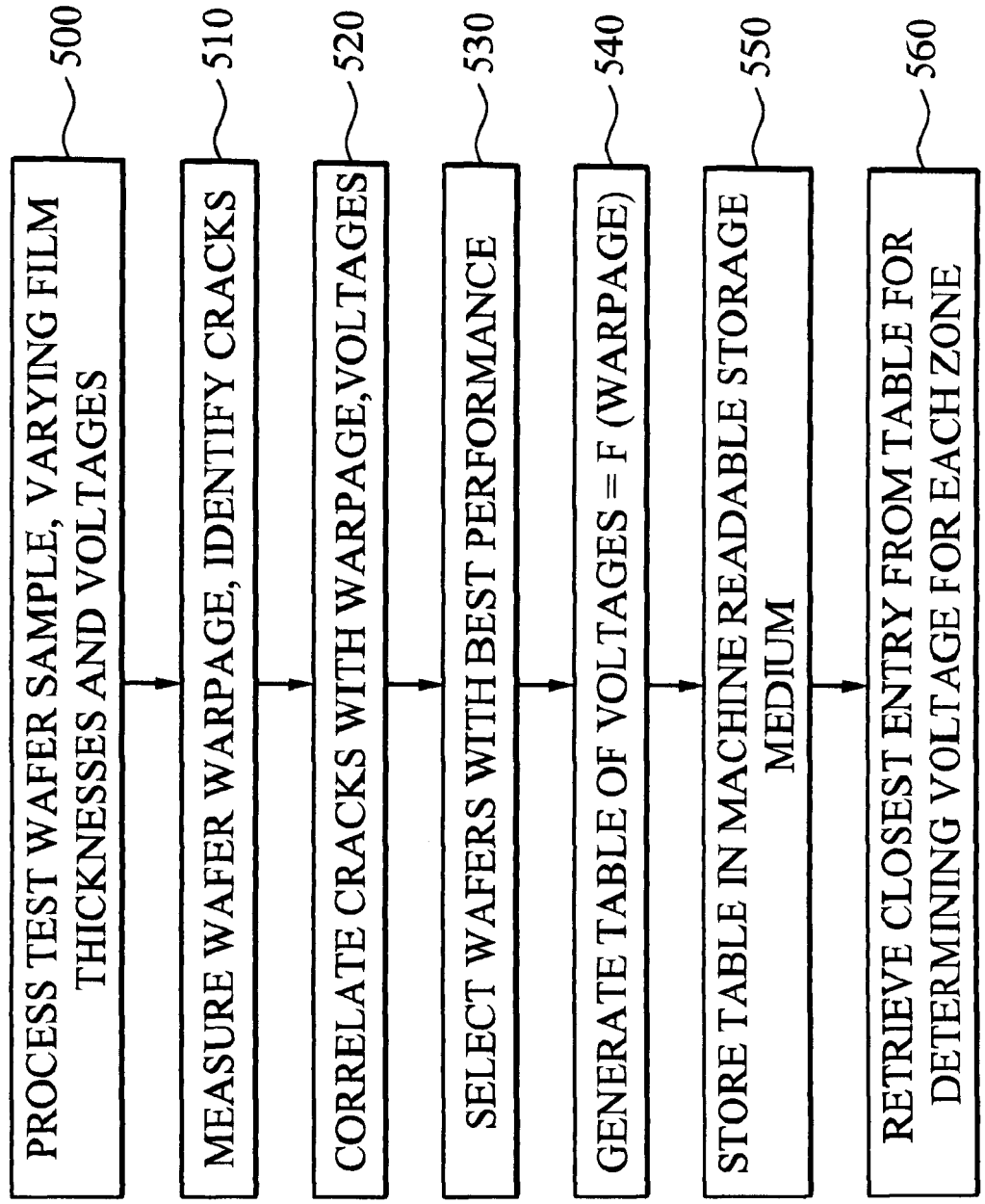
FIG. 5 is a flow chart of a method for collecting voltage profile data for a sample of wafers, and providing a table for use in controlling the tool of FIG. 1.

FIG. 5 is a flow chart of one example for determining a chucking voltage profile for the electrostatic chuck 200.

At step 500, a sample of test wafers are processed, varying film thicknesses and the voltages in each zone of the electrostatic chuck. At step 510, the wafer warpage for each test wafer is measured, and cracks are identified and quantified. The warpage may be quantified based on the height variation, or a curvature of the top surface of the wafer.

At step 520, the cracks are correlated with the wafer warpage and voltage, based on the sample of test wafers.

At step 530, the wafers with the best performance are selected from among the wafers of the test sample. For example, in some embodiments, at each warpage level, the voltage profile yielding the fewest cracks may be selected. If there is a tie or less than a threshold difference between the crack counts for two different voltage profiles, then the voltage profile that most reduces the warpage while the wafer is held by the electrostatic chuck may be selected as the tie breaker.

In other embodiments, at each warpage level, the voltage profile that most reduces the warpage while the wafer is held by the electrostatic chuck may be selected. If there is a tie or less than a threshold difference between the warpage for two different voltage profiles, then the voltage profile yielding the fewest cracks may be selected as the tie breaker.

At step 540, a table is generated. Each entry of the table is based on one of the selected test wafers, and has a value representative of warpage (e.g., height variation or curvature), and a plurality of voltages for each entry.

At step 550, the table is stored in a machine readable storage medium, for use in determining the voltage profile for individual wafers.

At step 560, upon identification of a warpage value for a wafer to be processed in tool 100, the closest entry is retrieved from the table for determining the voltage in each zone. In some embodiments, the two closest entries, between which the warpage value of the wafer to be processed lies, are provided, and an interpolation is performed to provide the voltages for each zone.

Although FIG. 5 shows a process employing table look up, in other embodiments, the selected test data (representing the best voltage profile for each warpage amount) are analyzed using a regression technique to provide a least squares best-fit equation for calculating each of the at least two different voltages in a computer coupled to the electrostatic chuck. For each voltage zone of the electrostatic chuck, a respective regression equation provides the voltage as a continuous function of the warpage.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method for processing a semiconductor wafer, comprising:
    providing test data from a plurality of test wafers, the test data including number of wafer cracks observed with a plurality of chucking voltages applied to respective portions of the test wafers by an electrostatic chuck for holding the test wafers, and warpage amounts for each of the plurality of test wafers;
    for each warpage amount, selecting a plurality of chucking voltages for which the number of cracks observed at that warpage amount in the test data is fewest;
    measuring data indicating an amount of warpage of an additional wafer;
    determining at least two different voltages to be applied to respective portions of the additional wafer by an electrostatic chuck that is to hold the additional wafer, based on the amount of warpage and the selected chucking voltages corresponding to the measured amount of warpage;
    applying the at least two different voltages to hold the respective portions of the additional wafer while performing a fabrication process on the additional wafer.

2. The method of claim 1, wherein the applying step includes applying a respectively different voltage to each of a plurality of zones of the electrostatic chuck.

3. The method of claim 2, wherein the electrostatic chuck has a center zone and an outer zone, and the voltage applied to the outer zone is greater than the voltage applied to the center zone.

4. The method of claim 3, wherein the electrostatic chuck has an intermediate zone between the center zone and the outer zone, and the voltage applied to the intermediate zone is between the voltage applied to the outer zone and the voltage applied to the center zone.

5. The method of claim 2, wherein the determining step includes calculating each of the at least two different voltages in a computer coupled to the electrostatic chuck.

6. The method of claim 2, further comprising:
    storing the test data in a table,
    wherein the determining step includes performing a table lookup.

7. The method of claim 6, wherein the determining includes selecting a set of chucking voltages from the table corresponding to an amount of warpage closest to the amount of warpage of the wafer.

8. The method of claim 6, wherein the determining includes:
    selecting two sets of chucking voltages from the table corresponding to two respective amounts of warpage closest to the amount of warpage of the wafer; and
    interpolating between the two sets of chucking voltages to determine the at least two different voltages.

9. The method of claim 1, wherein the measuring includes measuring a height of a plurality of points on a top surface of the wafer.

10. The method of claim 9, wherein the measuring includes measuring the height with a laser.

11. The method of claim 1, wherein the measuring is performed in situ in a tool where the fabrication process is performed.

12. A semiconductor fabrication tool, comprising:
    a metrology chamber configured to measure an amount of warpage of a semiconductor substrate;
    a buffer chamber sealingly coupled to the metrology chamber; and
    a process chamber sealingly coupled to the buffer chamber and configured for performing a material deposition or removal step on a semiconductor substrate, the process chamber having an electrostatic chuck therein, the electrostatic chuck having at least two zones having independently controllable voltages for applying a holding force to the substrate;
    a processor coupled to receive data representing the amount of warpage from the metrology chamber and configured to determine the voltages of the at least two zones based on the amount of warpage, the voltages to be used by the electrostatic chuck for applying the holding force; and
    a storage device for providing voltage data to the processor, the storage device storing for each warpage amount, a plurality of chucking voltages for which the number of cracks observed at that warpage amount in a set of test data is fewest, wherein the test data include numbers of wafer cracks observed with a plurality of chucking voltages applied to respective portions of a plurality of test wafers by an electrostatic chuck for holding the test wafers, and warpage amounts.

13. The tool of claim 12, wherein the electrostatic chuck has a center zone and an outer zone, and the voltage applied to the outer zone is greater than the voltage applied to the center zone.

14. The tool of claim 13, wherein the electrostatic chuck has an intermediate zone between the center zone and the outer zone, and the voltage applied to the intermediate zone is between the voltage applied to the outer zone and the voltage applied to the center zone.

15. The tool of claim 12, further comprising:
- a machine readable storage medium connected to the processor, the storage medium containing a table of test data from a plurality of test wafers, the test data correlating test wafer cracking with a plurality of warpage amounts and respective chucking voltages for each of a plurality of zones of the test wafers;
- wherein the processor determines the at least two voltages partly based on the test data in addition to the amount of warpage.

16. The tool of claim 12, wherein the metrology chamber comprises a laser for measuring a height of a top surface of the semiconductor substrate at a plurality of points on the surface.

17. A computer readable non-transitory storage medium encoded with computer program code, such that when the program code is executed by a processor, the processor performs a control method for processing a semiconductor wafer, comprising:
- controlling a metrology device to measure data indicating an amount of warpage of the wafer;
- retrieving data from a storage device, the storage device storing for each warpage amount, a plurality of chucking voltages for which the number of cracks observed at that warpage amount in a set of test data is fewest, wherein the test data include numbers of wafer cracks observed with a plurality of chucking voltages applied to respective portions of a plurality of test wafers by an electrostatic chuck for holding the test wafers, and warpage amounts,
- determining from the retrieved data at least two different voltages to be applied to respective portions of the wafer by an electrostatic chuck that is to hold the wafer, based on the amount of warpage;
- controlling the electrostatic chuck to apply the at least two different voltages to hold the respective portions of the wafer while performing a fabrication process on the wafer.

18. The computer readable storage medium of claim 17, wherein the applying step includes applying a respectively different voltage to each of a plurality of zones of the electrostatic chuck.

19. The computer readable storage medium of claim 18, wherein the electrostatic chuck has a center zone and an outer zone, and the voltage applied to the outer zone is greater than the voltage applied to the center zone, and the electrostatic chuck has an intermediate zone between the center zone and the outer zone, and the voltage applied to the intermediate zone is between the voltage applied to the outer zone and the voltage applied to the center zone.

20. The computer readable storage medium of claim 18, wherein the method further comprises:
- receiving test data from a plurality of test wafers, the test data correlating test wafer cracking with a plurality of chucking voltages and warpage amounts for each of a plurality of zones of the test wafers;
- storing the test data in a table,
- wherein the determining step is also based on the test data.

* * * * *

UNITED STATES PATENT AND TRADEMARK OFFICE
CERTIFICATE OF CORRECTION

Page 1 of 2

| | |
|---|---|
| PATENT NO. | : 7,957,118 B2 |
| APPLICATION NO. | : 12/433680 |
| DATED | : June 7, 2011 |
| INVENTOR(S) | : Yi-Pin Chang et al. |

It is certified that error appears in the above-identified patent and that said Letters Patent is hereby corrected as shown below:

Delete Drawing Sheet 5 of 6 and substitute therefore the attached Drawing Sheet 5 of 6 consisting of corrected FIG. 5.

Signed and Sealed this
Fourth Day of October, 2011

David J. Kappos
*Director of the United States Patent and Trademark Office*